United States Patent
Duffner et al.

[11] Patent Number: 5,982,827
[45] Date of Patent: Nov. 9, 1999

[54] MEANS FOR VIRTUAL DESKEWING OF HIGH/INTERMEDIATE/LOW DUT DATA

[75] Inventors: Barbara J. Duffner, Fort Collins, Colo.; Martin Fischer, Heilbronn, Germany; Ronnie E. Owens, Fort Collins, Colo.

[73] Assignee: Hewlett-Packard Co., Palo Alto, Calif.

[21] Appl. No.: 08/855,976

[22] Filed: May 14, 1997

[51] Int. Cl.⁶ .................................................. H04L 7/00
[52] U.S. Cl. ......................... 375/354; 713/500; 713/503
[58] Field of Search .................................. 375/354, 355; 371/1; 327/261, 263, 276, 277; 354/354; 713/500, 503

[56] References Cited

U.S. PATENT DOCUMENTS

| | | |
|---|---|---|
| 5,001,731 | 3/1991 | Atwell, Jr. et al. ...................... 375/107 |
| 5,003,194 | 3/1991 | Engelhard . |
| 5,120,989 | 6/1992 | Johnson et al. ......................... 307/269 |
| 5,193,164 | 3/1993 | Shon ....................................... 395/425 |
| 5,214,680 | 5/1993 | Gutierrez et al. . |
| 5,243,227 | 9/1993 | Gutierrez et al. . |
| 5,283,631 | 2/1994 | Koerner et al. . |
| 5,313,501 | 5/1994 | Thacker .................................. 375/117 |
| 5,336,944 | 8/1994 | Fischer . |
| 5,430,737 | 7/1995 | Yamashita et al. ..................... 371/25.1 |
| 5,469,083 | 11/1995 | Puester et al. ............................ 326/93 |
| 5,486,783 | 1/1996 | Baumert et al. ........................ 327/147 |
| 5,570,053 | 10/1996 | Takla ....................................... 327/292 |
| 5,579,251 | 11/1996 | Sato ........................................ 364/579 |
| 5,621,774 | 4/1997 | Ishibashi et al. ....................... 375/371 |
| 5,852,640 | 12/1998 | Kliza et al. ............................. 375/356 |

FOREIGN PATENT DOCUMENTS

0174409A1  8/1984  European Pat. Off. ........ G01R 31/28

*Primary Examiner*—Stephen Chin
*Assistant Examiner*—Mohammad Ghayour

[57] ABSTRACT

A method and apparatus are provided for accomplishing virtual deskewing of device-under-test data received by a test system by skewing clock signals instead. In a preferred embodiment, the invention includes a receiver circuit which is capable of operating in a window compare mode to capture a transition of a data signal from either a low data state to a high data state or a high data state to a low data state. The receiver circuit receives a high-level comparator signal and a low-level comparator signal, which when properly deskewed, together indicate what state the data signal is in.

19 Claims, 10 Drawing Sheets

MEANS FOR VIRTUAL DESKEWING OF HIGH/INTERMEDIATE/LOW DUT DATA

FIELD OF THE INVENTION

The present invention relates generally to the field of electrical data deskewing, and more particularly to a system and method for deskewing data by skewing clock enable signals.

BACKGROUND OF THE INVENTION

Recent improvements of electronic circuitry with corresponding increases in speed of operation, has created a need for more efficient and faster testing systems. One method for increasing system efficiency and speed is to integrate as much of the system as possible into a single CMOS IC (integrated circuit). Such high-level integration increases speed and efficiency because signals have less distance to travel. A well-designed CMOS chip also increases noise immunity of internal signals.

Prior art test equipment systems must provide an interface from which to send and receive signals. Generally, this interface provides an output driver circuit for driving output signals onto an external line and a receiver circuit for receiving each signal coming from an external device. Typically, the receiver circuits used in a test equipment system must be able to operate in one of at least two modes. In a first mode, the receiver circuit must have the capability of operating in a transparent mode, whereby the data passed on to the test equipment system follows that of the incoming data. In a second mode, the receiver circuit must have the capability to detect whether any transition occurred on an incoming signal. The second mode, which may be called window compare mode, is useful for detecting glitches on a signal which should be constant over a long period of time. For example, if the incoming data signal received by the receiver circuit is a clock signal, window compare mode may be enabled to determine if a glitch occurred on the clock signal and unintentionally clocked another device. To accommodate these two modes, most typical prior art test systems include window latches in their receiver circuits which may operate in either transparent mode or window compare mode.

In a digital test system, a digital signal may assume any one of a defined number of levels, dependent only upon the degree of signal quantization used by the test system. For example, in a binary system, a digital signal represents a "zero" or a "one". FIG. 1 is a graphical illustration of the relationship in a binary digital circuit between the high reference voltage threshold, the low reference voltage threshold, and voltage levels recognized by the digital circuit with respect to these voltages. As shown in FIG. 1, a binary digital signal is detected as a "zero" or "one" when it comes within a defined voltage range which is delineated by defined voltage thresholds. Thus, as shown in FIG. 1, a "zero" is detected and said to be in a valid low state whenever the binary digital signal is below a low reference voltage threshold defined by VREFL. A "one" is likewise detected and said to be in a valid high state whenever the signal is above a high reference voltage threshold defined by VREFH. Using this simple voltage range recognition technique, digital circuit components easily classify an input signal as a "zero" or "one" when the signal is within either the range below the low reference voltage threshold VREFL or the range above the high reference voltage threshold VREFH. However, when the input signal is transitioning from one state to the other (i.e., when the input signal is above the low reference voltage threshold VREFL but below the high reference voltage threshold VREFH), the signal is in an intermediate state and said to be "floating". In the intermediate state, the level of the signal recognized by the digital circuit component is indeterminate. In a binary digital system, the specific voltage levels corresponding to the high reference voltage threshold VREFH and the low reference voltage threshold VREFL may both vary depending upon the family of components used or upon the specific application. For example, in transistor-transistor logic (TTL), a commonly used component family, the high reference voltage threshold may be +2.0 volts and the low reference voltage threshold may be +0.8 volts. Likewise, in CMOS components, the high reference voltage threshold may be 3.15 volts and the low reference voltage threshold may be 0.9 volts. For ECL components, the high reference voltage threshold may be −1.105 volts and the low reference voltage threshold may be −1.475 volts. FIG. 1 illustrates a signal in a binary system. Digital test systems, however, may be based on any number of different quantization levels, where each level is associated with a defined voltage range delineated by defined reference voltage thresholds.

FIG. 2 illustrates an example binary digital test system 10 connected to an external device under test (DUT) 20. As shown in FIG. 2, the DUT 20 receives input signals I[0]–I[m] from the test system 10 and provides output signals O[0]–O[n] which are received by the test system 10. As also shown in FIG. 2, the test system 10 generally includes an output driver circuit 18 for each of the input signals I[0]–I[m] generated by system circuitry 30 of the test system 10. The test system 10 also generally includes a receiver circuit 16 for each of the output signals O[0]–O[n] that are received from the DUT 20, decoded and sent to the system circuitry 30. Typical receiver circuits include a high level comparator 12 and a low level comparator 14, which may reside either internal or external (as shown in FIG. 2) to the receiver circuit 16. The high-level comparator 12 generally compares the output signal O[x], where x::0..n, received from the DUT 20 to a high reference voltage VREFH and outputs a high-level comparator signal HLC[x] for use by the receiver circuit 16. Similarly, the low-level comparator 14 generally compares the output signal O[x] received from the DUT 20 to a low reference voltage VREFL and outputs a low-level comparator signal LLC[x] for use by the receiver circuit 16. The defined polarity of each of the high-level comparator signal HLC[x] and the low-level comparator signal LLC[x] may depend on the implementation of the receiver circuit 16. For example, FIG. 3 illustrates a sample output signal O[x] which crosses the low reference voltage VREFL and the high reference voltage VREFH, in sequence starting from below VREFL, as follows: above VREFL, above VREFH, below VREFH, back above VREFH, back below VREFH, below VREFL, back above VREFL, back below VREFL, and back above VREFL. Typical receiver circuits expect the same polarity on both the respective high-level comparator signal HLC[x] and low-level comparator signal LLC[x] if the output signal O[x] is above the respective reference voltages VREFH and VREFL. In other words, when the output signal O[x] is above the low reference voltage VREFL, the low level comparator signal LLC[x] will be logically high (or logically low if the receiver circuit 16 is based on the opposite polarity), and when the output signal O[x] is above the high reference voltage VREFH, the high level comparator signal HLC[x] will be logically high (or logically low if the receiver circuit 16 is based on the opposite polarity). So, as shown in FIG. 3, the LLC[x] signal is a high polarity whenever the output signal O[x] crosses above the VREFL threshold, and the HLC[x] signal is a high polarity whenever the output signal O[x] crosses above the VREFH threshold. This is typical when using a similar type comparator for generating both the high-level compare signal HLC[x] and the low-level compare signal LLC[x]. As known by those skilled in the art, utilizing inverting comparators will generate HLC and LLC signals which are the inverted version of those shown in FIG. 3.

Alternatively, the receiver circuit 16 may require HLC[x] and LLC[x] signals which more closely map the location of the signal O[x]. This may be accomplished by utilizing an inverting comparator for the low-level comparator 14 while maintaining a non-inverting comparator for the high-level comparator 12, or vice versa. Thus, the LLC[x] signal shown in FIG. 4 is generated by an inverting comparator and the HLC[x] signal is generated by a non-inverting compartator. As shown in FIG. 4, for an identical output signal O[x] as that shown in FIG. 3, the use of an inverting comparator for low-level comparator 14 results in an LLC[x] signal which is the inverted version of the LLC[x] signal shown in FIG. 3, where a non-inverting comparator is used for low-level comparator 14. The benefit of utilizing an inverting and a non-inverting comparator to generate the LLC and HLC signals respectively as shown in FIG. 4, is that the HLC[x] signal is high (or "asserted") only when the output signal O[x] is valid high, and the LLC[x] signal is high (or "asserted") only when the output signal O[x] is valid low. This scheme simplifies the necessary decoding to determine whether the output signal O[x] is in a valid state or an intermediate state. Again, as known by those skilled in the art, the polarity of the HLC[x] and LLC[x] signals may be reversed if the receiver circuit 16 recognizes asserted low signals instead of asserted high signals. In this case, the high-level comparator 12 would be implemented with an inverting comparator and the low-level comparator 14 would be implemented with a non-inverting comparator.

Regardless of the definition of the polarities of each of the high-level compare signal HLC[x] and low-level compare signal LLC[x], the receiver circuit 16 typically generates a high data signal HD[x], a low data signal LD[x], and an intermediate data signal ID[x], each of which is asserted only when the output signal O[x] is in a respective high voltage range, intermediate voltage range, or low voltage range. Accordingly, only one data signal HD[x], LD[x], or ID[x], is asserted at any given time.

It is known in the art that electrical signals derived from the same source but traveling different paths, even when the paths are theoretically identical, may not arrive downstream at the same time. In other words, with reference to the test system 10 of FIG. 2, even though the high level comparator 12 and low level comparator 14 circuit elements may be identical, and the distance between the initial receipt of an output signal O[x] and the different inputs to the respective comparators 12 and 14 may be identical, the HLC[x] and LLC[x] signals may not switch with the exact delay as the other path. This is known as data skew. Data skew may be introduced by process variations in the fabrication of the circuit, component variations, or by design (typically where one electrical path is longer in distance than another). FIG. 5 is a timing diagram of the example output signal O[x] which shows the uncompensated high-level and low-level comparator signals HLC[x] and LLC[x] where the LLC signal path has a longer delay that the HLC path. For comparison, the ideal timing of the low-level comparator signal LLC[x] is also shown.

Conventional prior art receiver circuits which provide a window compare mode compensate for data skew by introducing delay elements into the data signal paths. FIG. 6 shows a typical prior art receiver circuit 60 which compensates for data skew. The receiver circuit 60 shown in FIG. 6 receives the high-level comparator signal HLC and low-level comparator signal LLC. The HLC signal and LLC signal are each delayed by respective delay elements 61 and 62. The respective delayed signals H and L are logically NOR'd together by OR gate 63 to produce an intermediate signal I. Each of the respective delayed high H, intermediate I, and delayed low L signals are then passed through respective window latches 64, 65, 66. The window latches may be enabled to operate in a window compare mode, which captures a transition from high-to-low or from low-to-high by the respective delayed high H, intermediate I, and delayed low L signals, at any time during which a window compare mode enable signal WIN_EN is asserted (high). If the window latches are not enabled (i.e., if WIN_EN is low), the window latches operate like transparent latches by simply passing the respective delayed high H, intermediate I, and delayed low L signals to their respective outputs. The window latches 64, 65, 66 produce respective window latch output signals H1, I1 and L1. The receiver circuit 60 also includes a set of edge-triggered flip-flops 67, 68 and 69. One edge-triggered flip-flop 67 receives window latch output signal H1; another edge-triggered flip-flop 68 receives window latch output signal I1; and another edge-triggered flip-flop 69 receives window latch output signal L1. Each of the edge-triggered flip-flops captures the state of its respective input signal H1, I1 and L1 as high data HD, intermediate data ID, and low data LD signals when an active edge of a clock signal CK occurs.

FIG. 7 is a timing diagram illustrating the timing of the prior art receiver circuit 60 of FIG. 6 in both the transparent latch mode (i.e., where signal WIN_EN is low) and in window compare mode (i.e., where signal WIN_EN is high). As shown in FIG. 7, if a clock occurred at time t1, and it captured the uncompensated HLC and LLC, it would appear that the incoming data signal DATA was both high and low at the same moment in time, which is not valid. The deskewed data has the proper timing relationships so that the clock correctly captures the data as a low at time t1 and an intermediate at time t1'. At time t2, the clock correctly captures the data such that the data was both high and intermediate during some period during the window compare mode (i.e., where WIN_EN is asserted). As known by those skilled in the art, multiple values are valid when the receiver circuit is operating in window compare mode.

It will be appreciated by one skilled in the art that at a minimum the receiver circuit 60 will utilize one delay element to delay one or the other of the HLC or LLC signals. This is because one of the delay elements 61 or 62 may have a relative delay of zero, if it is known that one of the HLC or LLC paths is always longer, and thus is not needed. It will also be appreciated that the rest of the receiver circuit 60 of the prior art may be implemented in a variety of other ways; however, other prior art implementations generally utilize some type of delay element in the data path as shown in FIG. 6.

With the need for increased speed and efficiency in electrical test systems, it would be desirable from the standpoint of improving power consumption, cost and reliability to integrate more of the test system functionality into a CMOS chip. However, prior art receiver circuits such as that shown in FIG. 6 cannot be integrated into CMOS chips because the typical adjustable CMOS delay element may not have a high enough bandwidth (500 MHZ or more) for these signals, or may have only one precision edge (e.g., only the rising edge), and thus would not be suitable for delaying a data signal.

SUMMARY OF THE INVENTION

The present invention solves these problems by providing an apparatus and method for accomplishing virtual data deskewing by skewing clock signals instead. In the present invention, delay elements are not introduced directly into the data signal paths. Instead, a delayed high clock signal and a delayed low clock signal are generated which differ in delay amount in an amount substantially equal to the data skew caused by different delays in the respective data paths of two data signals. In the preferred embodiment, the two data signals are the high-level comparator signal and the low-level comparator signal which are derived from a single electrical data signal from an external device under test. The high-level comparator signal may be in an asserted state or a non-asserted state and the low-level comparator signal may be in an asserted state or a non-asserted state. Together the high-level comparator signal and low-level comparator signal indicate which state the electrical data signal is in. The data signal state may be one of a high data state wherein the electrical data signal is above a high voltage threshold, a low data state wherein the electrical data signal is below a low voltage threshold, or an intermediate state wherein the electrical data signal is above the low voltage threshold and below the high voltage threshold. A high data signal, which indicates that the electrical data signal is in the high data state, is generated only when the high-level comparator signal indicates that the electrical data signal is in the high data state at the time that the delayed high clock signal's active edge occurs. A not-high data signal, which indicates that the electrical data signal is not in the high data state, is generated only when the high-level comparator signal indicates that the electrical data signal is not in the high data state at the time that the delayed high clock signal's active edge occurs. A low data signal, which indicates that the electrical data signal is in the low data state, is generated only when the low-level comparator signal indicates that the electrical data signal is in the low data state at the time that the delayed low clock signal's active edge occurs. A not-low data signal, which indicates that the electrical data signal is not in the low data state, is generated only when the low-level comparator signal indicates that the electrical data signal is not in the low data state at the time that the delayed low clock signal's active edge occurs. An intermediate data signal is generated by decoding the high data signal, not-high data signal, low data signal, and not-low data signal.

A preferred embodiment of the present invention includes a receiver circuit which receives the high-level comparator signal and low-level comparator signal. The receiver circuit generates a high signal when the high-level-comparator signal is in its asserted state, a not-high signal when the high-level-comparator signal is in its non-asserted state, a low signal when the low-level-comparator signal is in its asserted state, and a not-low signal when the low-level-comparator signal is in its non-asserted state. The receiver circuit in the preferred embodiment comprises a window latch. The preferred embodiment of the present invention also includes a capture mechanism which receives the high signal, the not-high signal, the low signal and the not-low signal from the receiver circuit, as well as the delayed high clock signal and delayed low clock signal. The capture mechanism generates a high capture signal upon receipt of an active edge of the delayed high clock signal while the high signal is asserted, a not-high capture signal upon receipt of an active edge of the delayed high clock signal while the not-high signal is asserted, a low capture signal upon receipt of an active edge of the delayed low clock signal while the low signal is asserted, and a not-low capture signal upon receipt of an active edge of the delayed low clock signal while the not-low signal is asserted. The capture mechanism in the preferred embodiment is implemented with, but not limited to, D-type flip-flops. Finally, the preferred embodiment of the present invention includes a decoder circuit which receives the high capture signal, the not-high capture signal, the low capture signal and the not-low capture signal, and generates an intermediate capture signal based on states of the high capture signal, the not-high capture signal, the low capture signal and the not-low capture signal.

The delayed high clock signal and delayed low clock signal may be respectively generated by utilizing a respective and second delay element connected to receive a clock signal. In the alternative, if it is known that one of the HLC or LLC paths is always longer, the clock signal itself may serve as one of the high or low clock signals, while the other delayed clock signal is generated by delaying the clock signal.

BRIEF DESCRIPTIONS OF THE DRAWINGS

The objects and advantages of the invention will become more apparent and more readily appreciated from the following detailed description of the presently preferred exemplary embodiment of the invention taken in conjunction with the accompanying drawings, of which:

DETAILED DESCRIPTION OF THE PRESENT INVENTION

Figure 8:
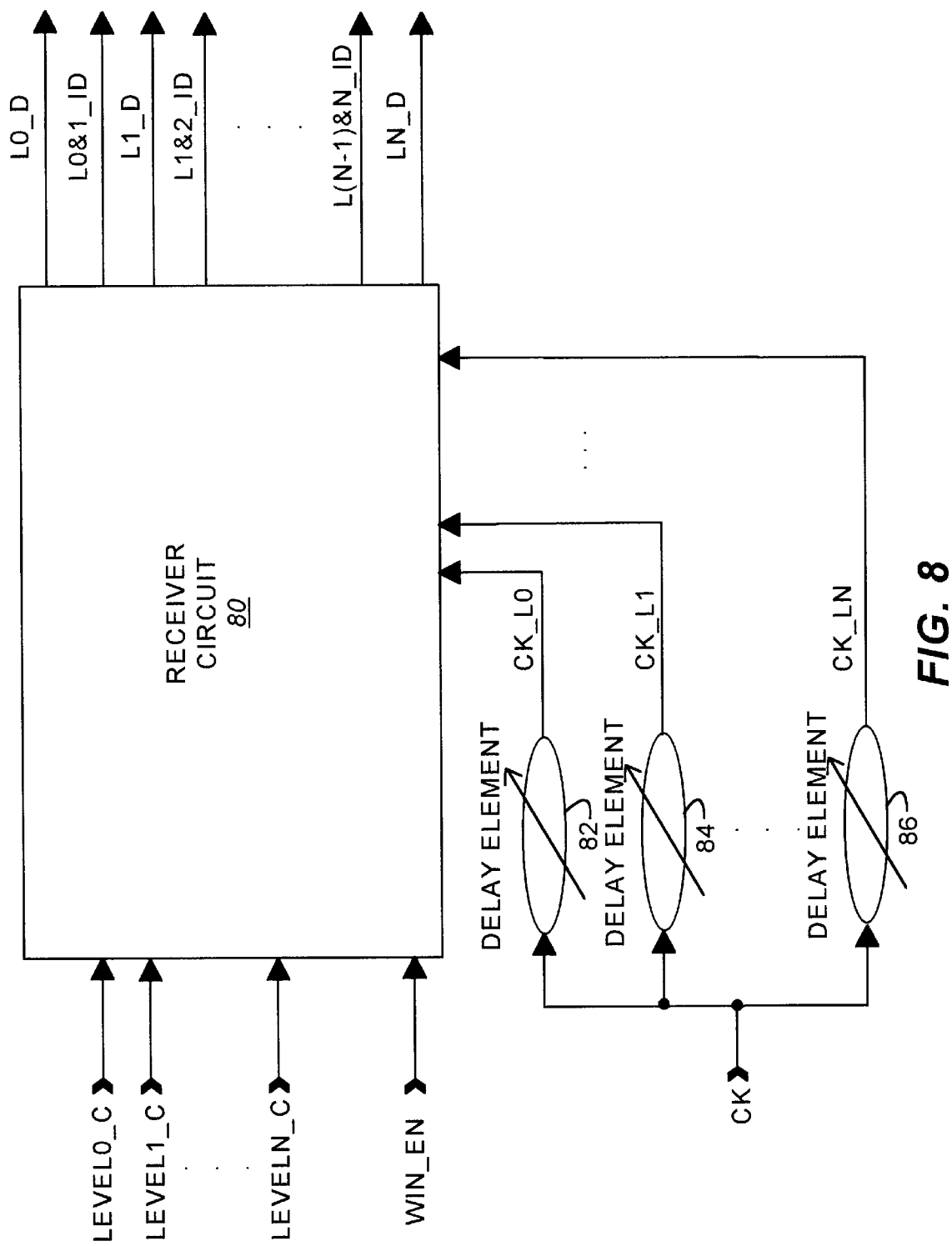
FIG. 8 is a block diagram of a virtual data de-skewing circuit of the present invention.

FIG. 8 is a block diagram of a virtual data de-skewing circuit of the present invention. As shown in FIG. 8, the present invention may extend to a digital system based on any number of different quantization levels L(0)–L(n), where each level is associated with a defined voltage range delineated by defined voltage thresholds and shown in FIG. 8 as comparator signals LEVEL0_C–LEVELN_C. As shown in FIG. 8, the functional circuitry of the receiver circuit 16 of the test system 10 is integrated into a single receiver circuit block 80, while external to the receiver circuit block 80 are delay elements 82–86 for respectively introducing delay to the clock signal CK to generate a delayed clock signal CK_L0–CK_LN for each comparator signal LEVEL0_C–LEVELN_C. The amount of delay introduced into each of the delayed clock signals CK_L0–CK_LN may be different and depends on the amount of data skew introduced into each of the data paths for comparator signals LEVEL0_C–LEVELN_C. The delay amounts are usually calibrated to provide precise synchronized switching time. It will be noted that the implementation details of the receiver circuit block 80 may vary depending on the polarity definitions of the comparator signals LEVEL0_C–LEVELN_C and output signals L0_D, L0&1_ID, L1_D, . . . , L(N–1)&N_ID, LN_D. The receiver circuit 80 also receives a window enable signal WIN_EN which determines whether the receiver circuit operates in transparent mode or in window compare mode. The novel feature of the virtual data de-skewing circuit of the present invention is that multiple data paths may be de-skewed not by introducing delay elements into the data paths themselves, but by de-skewing the clock signals instead.

The following discussion focuses on the operation of the present invention in a binary system. However, it is to be understood that the present invention is not meant to be limited to operation in a binary system and that implementations details contained hereinafter may be extended to a digital system based on any number of different quantization levels, where each level is associated with a defined voltage range delineated by defined voltage thresholds.

Figure 9:
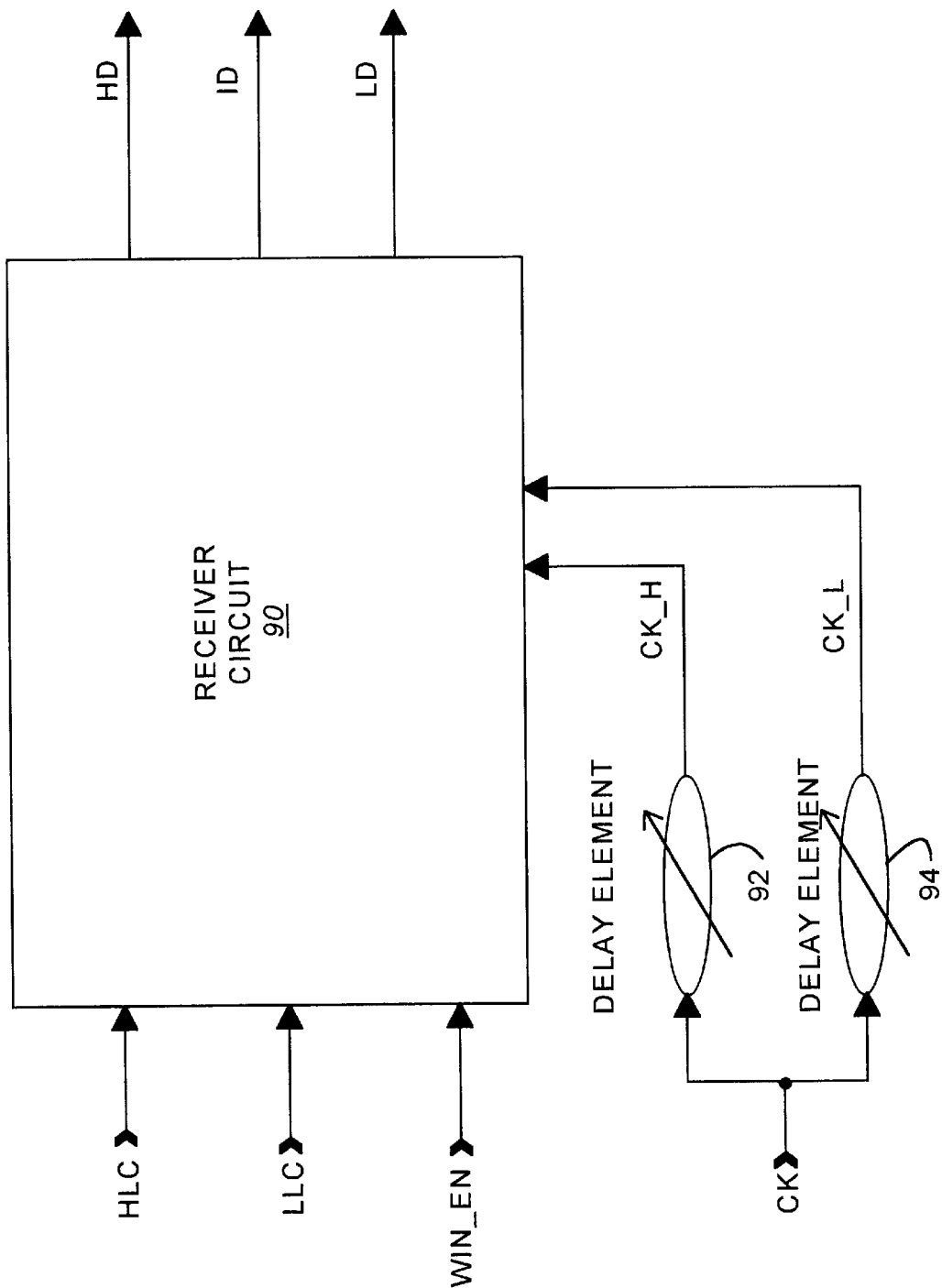
FIG. 9 is a block diagram of a virtual data de-skewing circuit for use in a binary digital test system.

FIG. 9 is a block diagram of a virtual data de-skewing circuit 90 of the present invention which may be used in a binary test system. As shown in FIG. 9, the present invention includes a receiver circuit block 90 and delay elements 92 and 94 for respectively introducing delay to the clock signal CK to generate a delayed high clock signal CK_H and a delayed low clock signal CK_L. The amount of delay that each of the delayed high clock signal CK_H and delayed low clock signal CK_L introduce may be different and depends on the amount of data skew introduced into each of the data paths for signals HLC and LLC. The delay amounts are calibrated to provide precise synchronized switching time. It will be noted that the implementation details of the receiver circuit block 90 may vary depending on the polarity definitions of the high-level comparator signal HLC, low-level comparator signal LLC, high data output signal HD, intermediate data output signal ID, and low data output signal LD.

Figure 1:
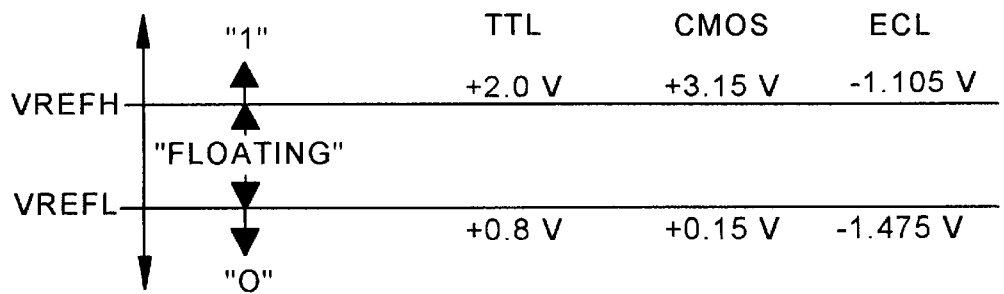
FIG. 1 is a graphical illustration of the relationship in a digital circuit between the high reference voltage threshold, the low reference voltage threshold, and voltage levels recognized by the digital circuit with respect to these voltages.
Figure 3:
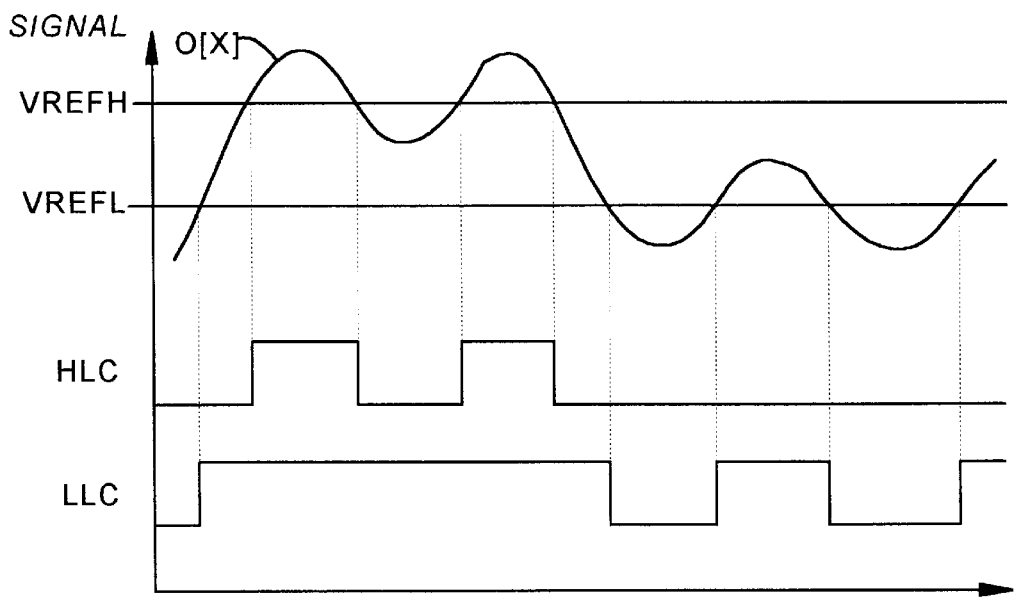
FIG. 3 is a sample timing diagram of an output signal O[x] and corresponding high-level comparator signal HLC[x] and low-level comparator signal LLC[x], both generated with a non-inverting comparators.
Figure 4:
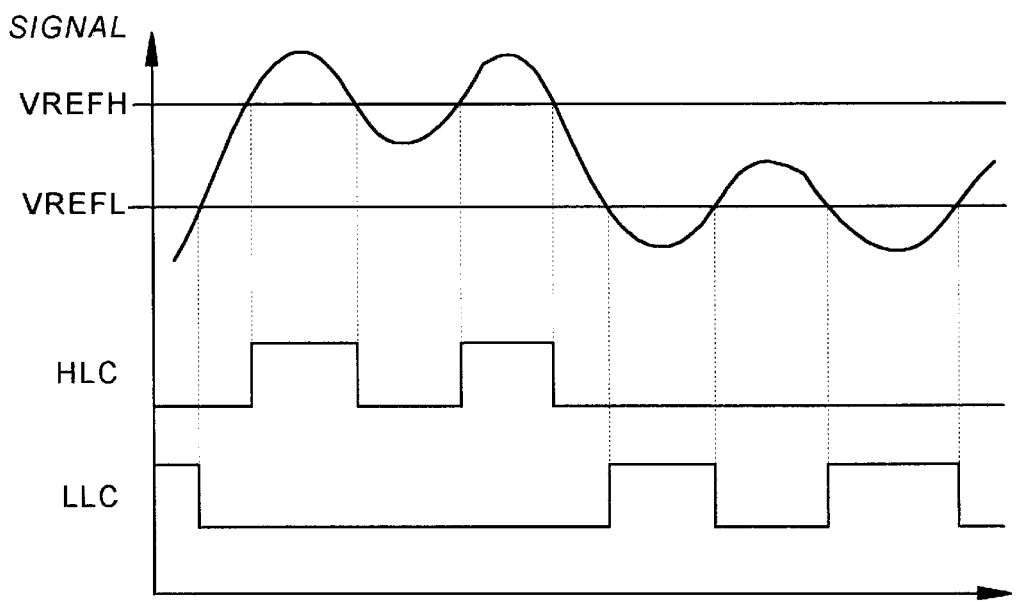
FIG. 4 is a sample timing diagram of the same output signal O[x] of FIG. 3 and corresponding high-level comparator signal HLC[x] generated with a non-inverting comparator, and low-level comparator signal LLC[x] generated with an inverting comparator.
Figure 2:
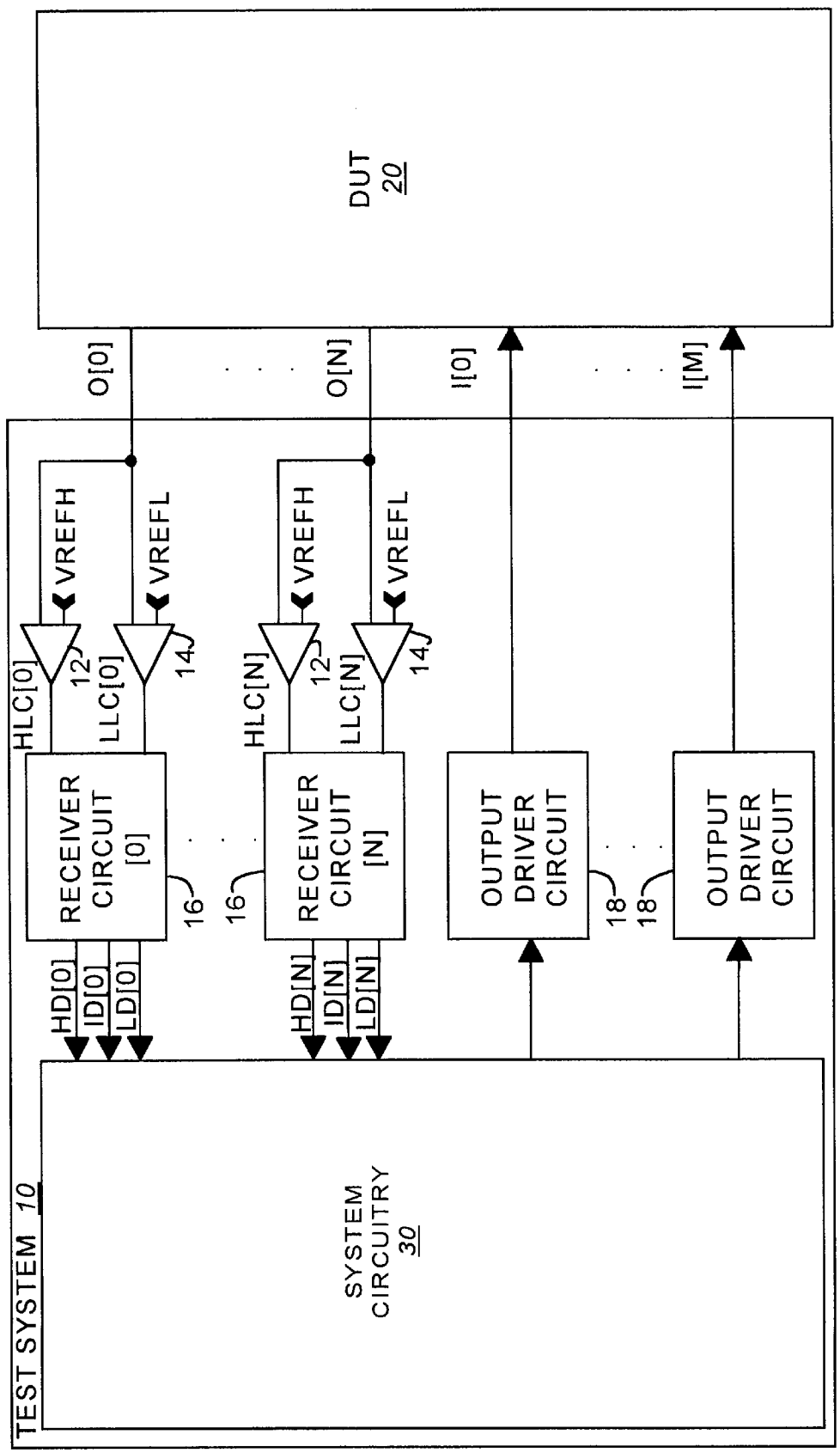
FIG. 2 is a block diagram of an example test system connected to an external device under test (DUT).
Figure 5:
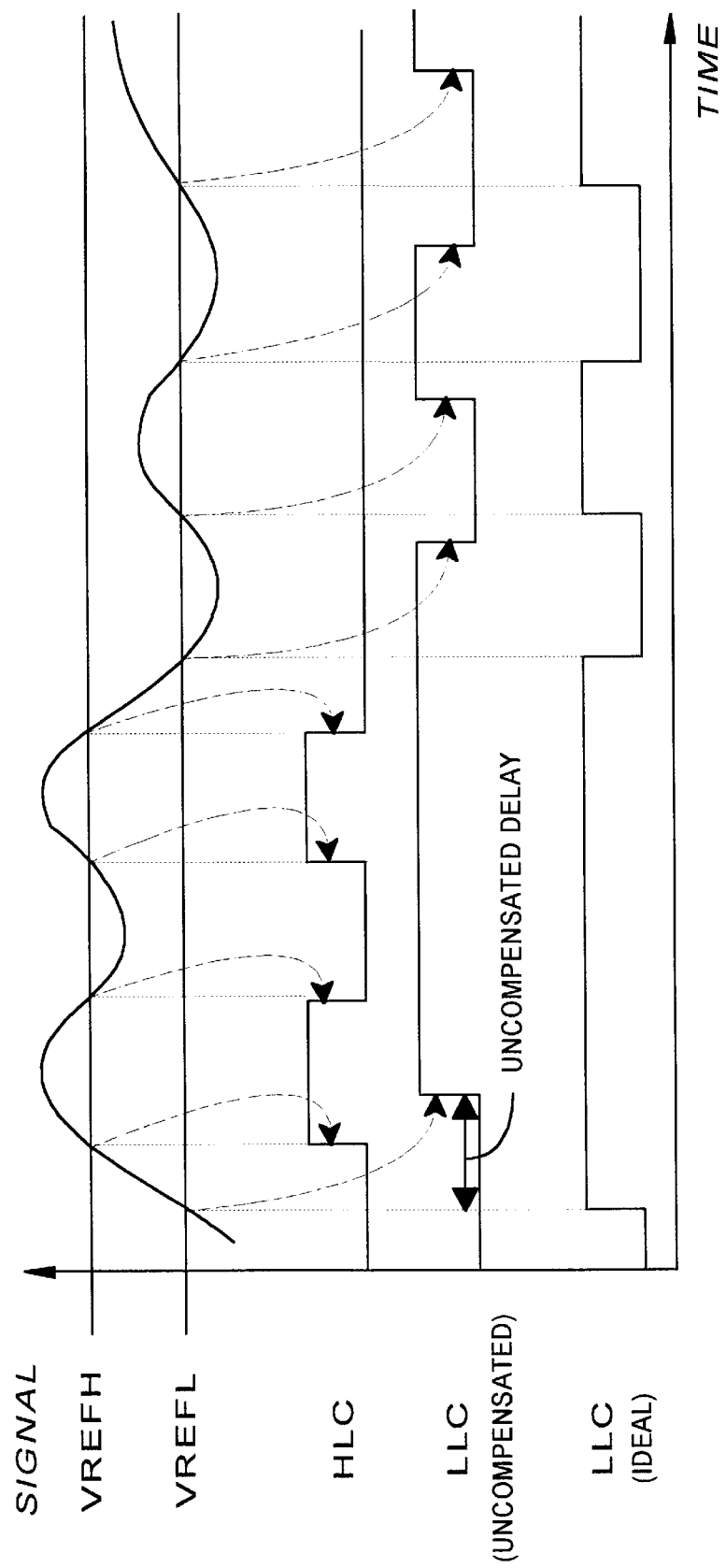
FIG. 5 is a timing diagram of the example output signal O[x] which shows the uncompensated high-level and low-level comparator signals HLC[x] and LLC[x], and the ideal LLC[x] signal for comparison.
Figure 6:
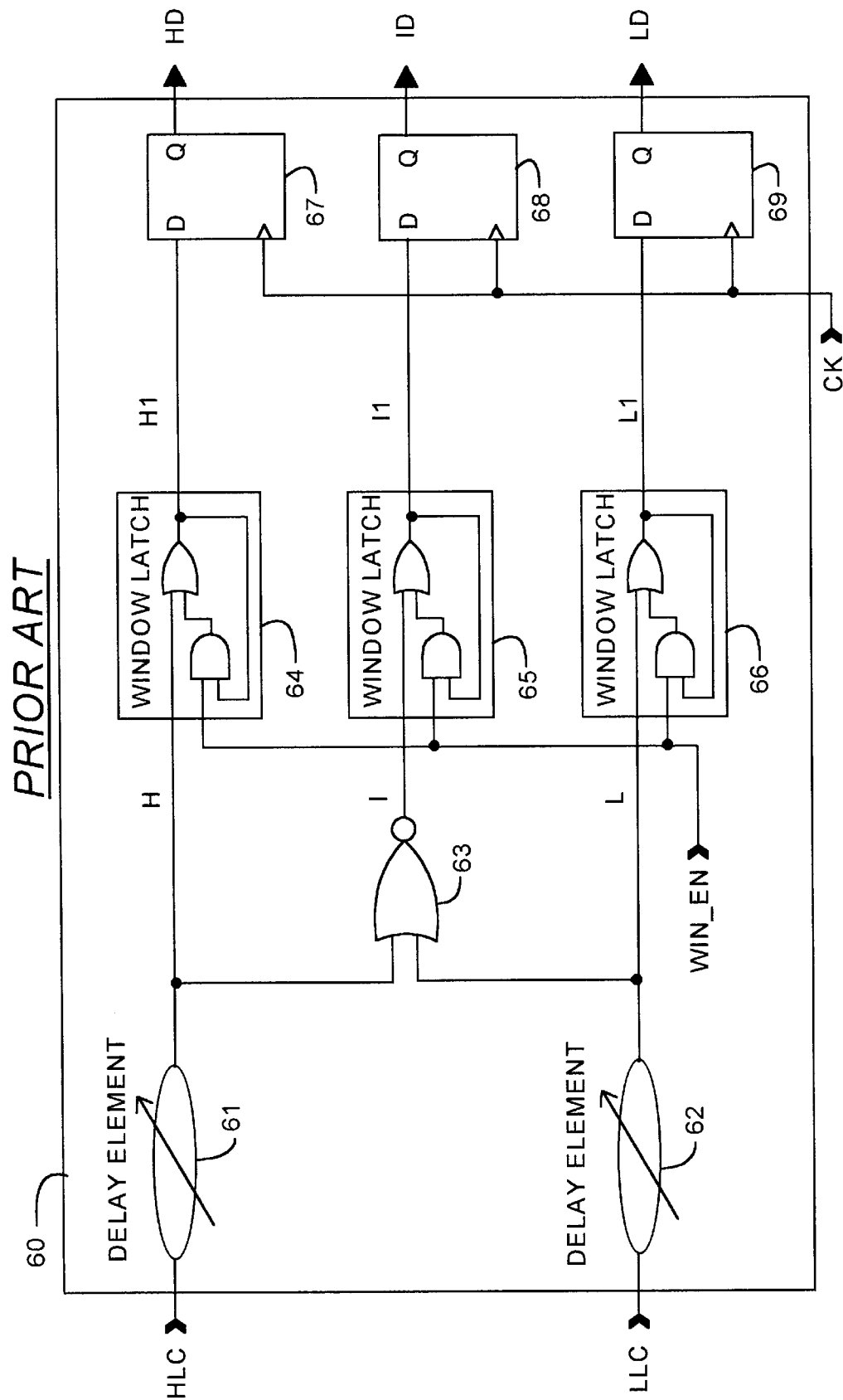
FIG. 6 shows a typical prior art receiver circuit which compensates for data skew.
Figure 7:
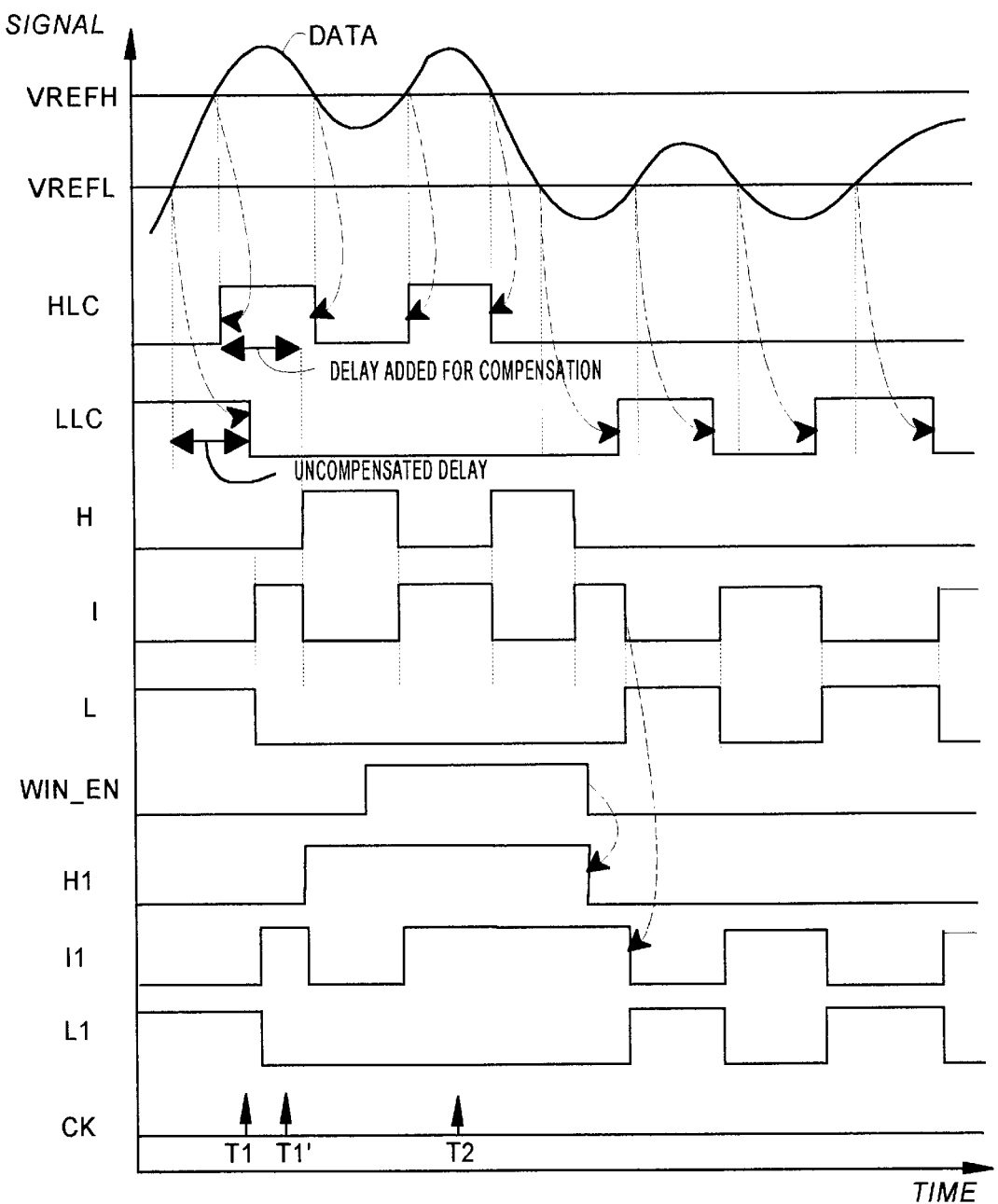
FIG. 7 is a timing diagram illustrating the timing of the prior art receiver circuit of FIG. 6.
Figure 10:
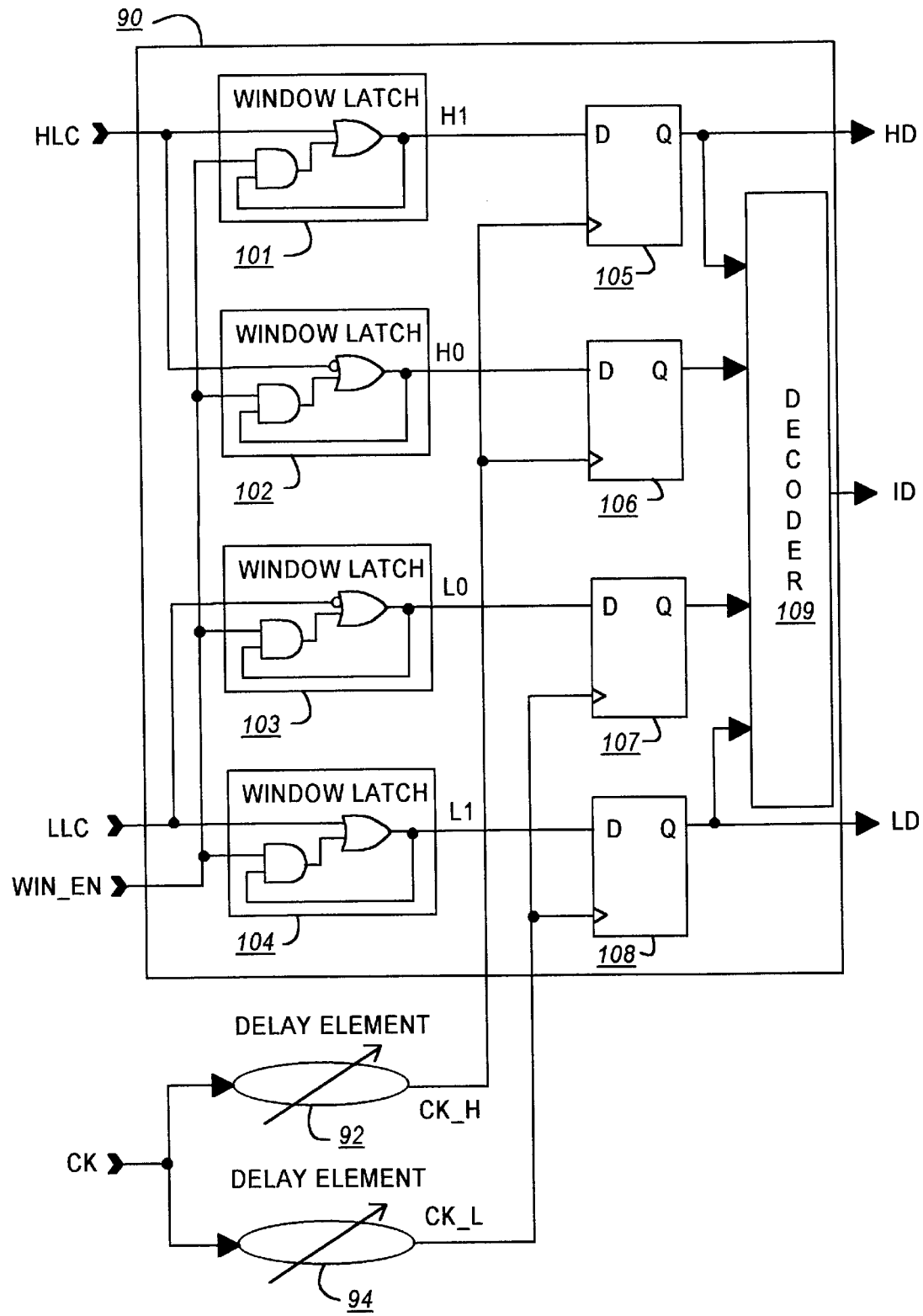
FIG. 10 is a schematic diagram of one preferred embodiment of the virtual data de-skewing circuit of the present invention.

FIG. 10 is a schematic diagram of one implementation of the receiver circuit block 90 of FIG. 9. In this implementation, the high-level compare signal HLC is generated using a non-inverting comparator with a high polarity indicating that the data signal is above the respective reference voltage threshold, and the low-level compare signal LLC is generated using an inverting comparator with a high polarity indicating that the data signal is below the respective reference voltage threshold. Accordingly, the polarity convention of HLC and LLC signals are defined as those shown in FIG. 3. As shown in FIG. 10, the receiver circuit 90 includes a plurality of window latches 101–104, a plurality of capture flip-flops 105–108, and a decoder circuit 109. Window latches 101 and 102 each receive the high-level compare signal HLC and window latches 103 and 104 each receive the low-level compare signal LLC. Window latches 102 and 104 invert the respective high-level compare signal HLC and low-level compare signal LLC before performing the window latch function. The window latches 101–104 output respective window latch output signals H1, H0, L0 and L1. The window latches may be enabled to operate in a window compare mode, which captures one of a transition from high-to-low or from low-to-high by the respective non-inverted HLC signal, inverted HLC signal, non-inverted LLC signal and inverted LLC signal, at any time during which a window compare mode enable signal WIN_EN is asserted (high). If the window latches are not enabled (i.e., if WIN_EN is low), the window latches 101–104 operate like transparent latches by simply passing the respective non-inverted HLC signal, inverted HLC signal, non-inverted LLC signal and inverted LLC signal to their respective outputs. The respective window latch output signals H1, H0, L1 and L0 are received as data input by respective capture flip-flops 105, 106, 107 and 108. Capture flip-flops 105 and 106 are clocked by delayed high clock signal CK_H generated by delay element 92. Capture flip-flops 107 and 108 are clocked by delayed low clock signal CK_L generated by delay element 94. Thus, compensation delay to deskew the HLC and LLC data signals is provided by the delayed high and low clock signals CK_H and CK_L. The output signal of capture flip-flop 105 represents the high data signal HD, and the output signal of capture flip-flop 108 represents the low data signal LD. The intermediate signal ID must be derived from the states of the output signals from all of the capture flip-flops 105–108 by a decoder 109. The decoder may be a 4:1 decoder, a multiplexor, or any other suitable means for determining if the output signal is in an intermediate state.

It will be appreciated by one skilled in the art that the components required to implement the receiver circuit 90, including the delay elements in the clock signal path used to generated the delayed high and low clock signals CK_H and CK_L, may be entirely implemented using CMOS technology. Accordingly, the entire receiver circuit may be integrated along with the rest of the test system onto a single CMOS device. The present invention thus reduces the size and improves performance of a test system.

Figure 11:
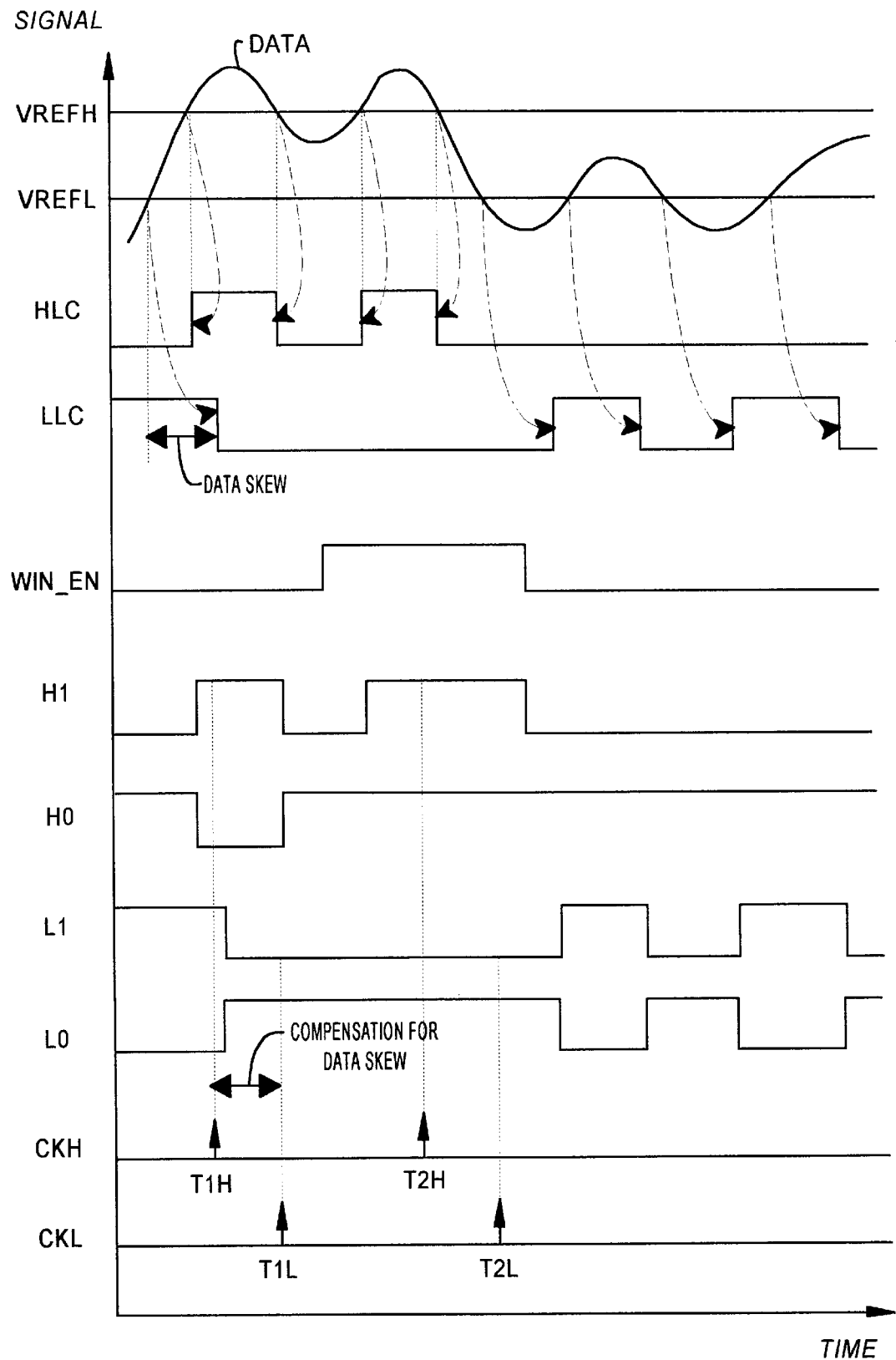
FIG. 11 is a timing diagram illustrating the timing of the virtual data de-skewing circuit of FIG. 10.

FIG. 11 is a timing diagram illustrating the timing of the receiver circuit 90 of FIG. 10 in both the transparent latch mode (i.e., where signal WIN_EN is low) and in window compare mode (i.e., where signal WIN_EN is high). As illustrated by FIG. 11, if all the window latch output data H1, H0, L1, L0 were captured by the same clock with no compensation, a clock at time t1H would capture both H1 and L1 active—an invalid state as with the prior art. However, the low data L1 and L0, are clocked at t1L, and the high data H1 and H0, are clocked at t1H, the signal is correctly captured—H1 is active, L1 is inactive, and L0 is active, which is decoded to an intermediate signal level. Similarly, if data is captured at t2 (high data at t2H and low data at t2L) during window compare mode (i.e., WIN_EN asserted), the data captured is both H0 and H1 active, as well as L0 active, indicating that the incoming data signal DATA was both high and not-high in the window, and also not-low. This would be decoded to the signal having been both high and intermediate during the window, just as with the prior art. This illustrates the need for all four window latches; if only H1 and L1 (or conversely, H0 and L0) were kept, the receiver circuit would only know that data had been high sometime during the window, and the intermediate state would be lost. It also illustrates why the intermediate state cannot be decoded prior to the capture latches because of the data skew. It will be appreciated by one skilled in the art that the timing diagram in FIG. 11 is not really to scale. Skews are typically very small relative to signal bandwidth, and the window enable signal WIN_EN is usually active for a relatively long period of time.

Figure 12:
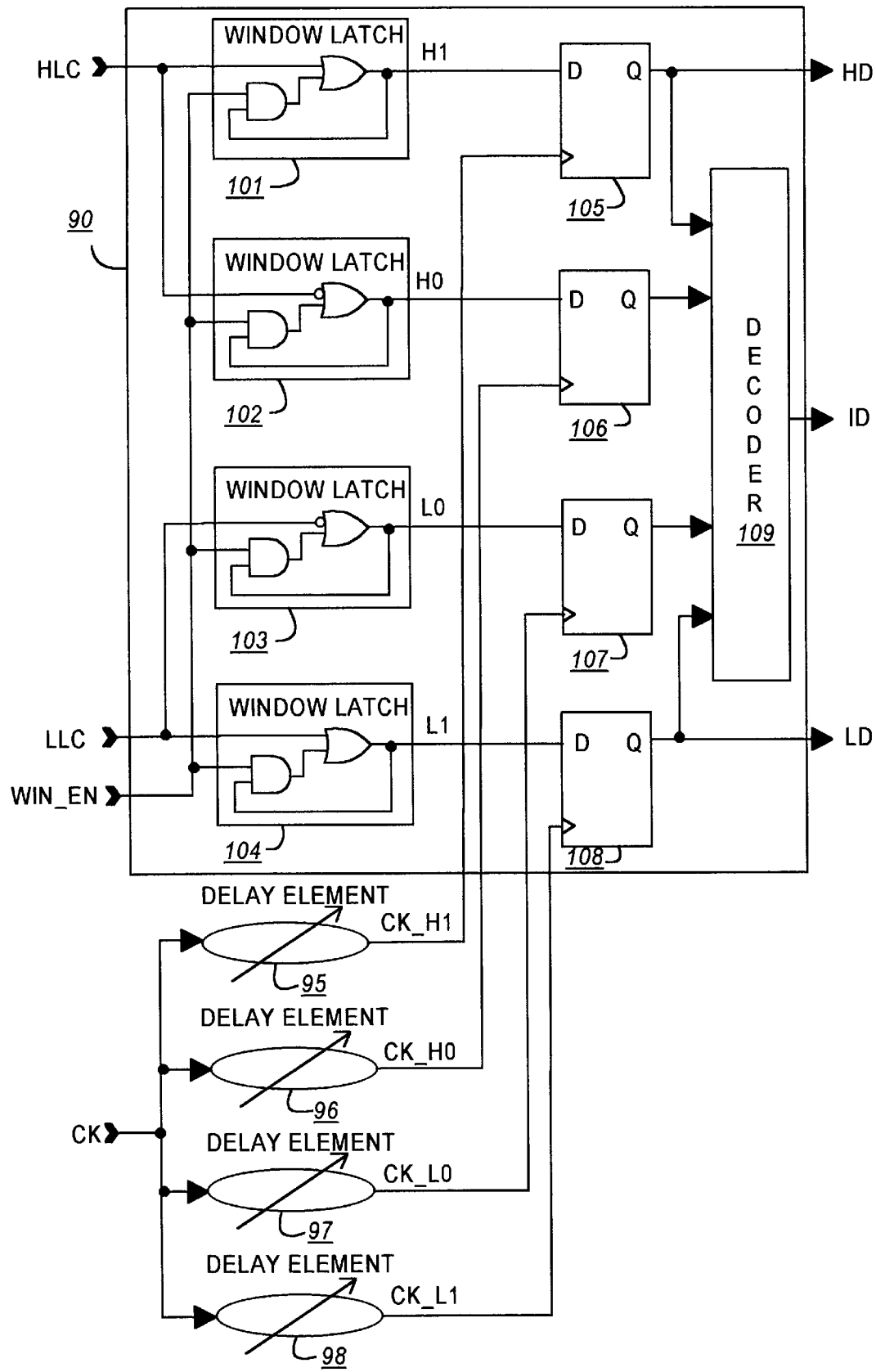
FIG. 12 is a schematic diagram of an alternative embodiment of the virtual data de-skewing circuit of the present invention.

FIG. 12 is a schematic diagram of an alternative embodiment of the receiver circuit block 90 of FIG. 9. This embodiment is identical to the implementation shown in FIG. 10, except that each of the capture flip-flops 105–108 receive a separate clock signal. Accordingly, capture flip-flop 105 is clocked by delayed high clock signal $CK_{13}$ H1 generated by delay element 95, capture flip-flop 106 is clocked by delayed high clock signal CK_H0 generated by delay element 96, capture flip-flop 107 is clocked by delayed low clock signal CK_L1 generated by delay element 97, and capture flip-flop 108 is clocked by delayed low clock signal CK_L0 generated by delay element 98. This might be done to further compensate for skew in the H1/H0 or L1/L0 window latch paths.

Various techniques are known in the art for implementing window latches and capture flip-flops. In the preferred embodiment of the present invention, it is contemplated that differential circuit techniques be utilized to provide a high common mode rejection ratio (CMRR), and hence improve noise immunity.

Delay elements used to provide delayed signals are also known in the art. Accordingly, any type of delay element presently known or hereinafter developed which provides suitable delay within the test system circuit requirements, including bandwidth limitations and minimum delay increments and precision, may be used to implement the delay elements which generate the delayed high and low clock signals CK_H and CK_L. In the preferred embodiment, the delay elements are implemented using a CMOS delay line, such as those described in "CMOS Pseudo NMOS Variable Capacitance Time Vernier", U.S. Pat. No. 5,214,680 to Gutierrez, Jr. et al.; "Variable Capacitance Delay Element", U.S. Pat. No. 5,283,631 to Koerner et al.; and "Fine/Coarse Wired-Or Tapped Delay Line", U.S. Pat. No. 5,243,227 to Gutierrez, Jr. et al.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An apparatus for accomplishing virtual data deskewing of a first data signal and at least one additional data signal, each said at least one additional data signal having an associated data skew which corresponds to a delay amount between when said first data signal becomes valid and when said respective at least one additional data signal becomes valid, said apparatus comprising:

a receiver circuit connected to receive said first data signal and said at least one additional data signal, said receiver circuit comprising:

a plurality of data mode detection mechanisms, at least one corresponding to each of said first data signal and said at least one additional data signal, and each selectable to operate in one or the other of a window compare mode or a transparent mode and which receives said corresponding one of said first data signal or said at least one additional data signal and generates a respective data mode signal corresponding to said respective first data signal or said at least one additional data signal;

a plurality of data capture mechanisms, at least one corresponding to each of said first data signal and said at least one additional data signal, wherein each of said plurality of data capture mechanisms receives said respective data mode signal corresponding to said first data signal or said at least one additional data signal and a corresponding clock signal, and captures said respective data mode signal in synchronization with said corresponding clock signal to generate a deskewed data state signal that corresponds to respective data mode signal, said corresponding clock signal having an associated clock skew substantially equal to said delay amount of said associated data skew between said corresponding first data signal and said at least one additional data signal.

2. The apparatus of claim 1, wherein said receiver circuit is integrated into a CMOS chip.

3. The apparatus of claim 2, wherein said plurality of clock signals are generated internal to said CMOS chip.

4. The apparatus of claim 1, wherein a zero relative delay clock signal represents at least one of said plurality of clock signals, and a delayed version of said zero relative delay clock signal represents at least one other of said plurality of clock signals.

5. The apparatus of claim 1, wherein at least one of said plurality of clock signals is generated by a first delay element connected to receive a clock signal and at least one other clock signal is generated by a second delay element connected to receive said clock signal.

6. An apparatus for accomplishing virtual data deskewing of a high-level data signal and a low-level data signal to generate an output signal representative of a data signal state of a data signal, said data signal state being in one of a high data state wherein said data signal is above a high voltage threshold, a low data state wherein said data signal is below a low voltage threshold, or an intermediate state wherein said data signal is above said low voltage threshold and below said high voltage threshold, said apparatus comprising:

a receiver circuit connected to receive said high-level data signal and said low-level data signal, said receiver circuit comprising:

a plurality of data mode detection mechanisms, at least one corresponding to each of said high-level data signal and said low-level data signal, and each selectable to operate in one or the other of a window compare mode or a transparent mode and which receives said corresponding one of said high-level data signal or said low-level data signal and generates a respective high data mode signal corresponding to said respective high-level data signal or a respective low data mode signal corresponding to said low-level data signal;

a plurality of data capture mechanisms, at least one corresponding to each of said high-level data signal and said low-level data signal, wherein each of said plurality of data capture mechanisms either receives said respective high data mode signal and a corresponding delayed high clock signal and captures said respective high data mode signal in synchronization with said corresponding delayed high clock signal to generate a deskewed high data state signal, or receives said respective low data mode signal and a corresponding delayed low clock signal and captures said respective low data mode signal in synchronization with said corresponding delayed low clock signal to generate a deskewed low data state signal, said high delayed clock signal and said low delayed clock signal having an associated clock skew substantially equal to said delay amount of said associated data skew between said corresponding high-level data signal and said low-level data signal.

7. The apparatus of claim 6, said receiver circuit comprising:
a decoder circuit which decodes said deskewed high data state signal and said deskewed low data state signal to produce an intermediate data state signal to indicate that said data signal is neither in said high data state nor in said low data state.

8. The apparatus of claim 6, wherein:
said plurality of data mode detection mechanisms comprises:
  a high-level data mode detection mechanism which generates said high data mode signal based on said high-level data signal, and
  a low-level data mode detection mechanism which generates said low data mode signal based on said low-level data signal; and
said plurality of data capture mechanisms comprises:
  a high-level data capture mechanism which receives said high data mode signal and said delayed high clock signal, captures said high data mode signal in synchronization with said delayed high clock signal to generate said deskewed high data state signal, and
  a low-level data capture mechanism which receives said low data mode signal and said delayed low clock signal, captures said low data mode signal in synchronization with said delayed low clock signal to generate said deskewed low data state signal.

9. The apparatus of claim 8, wherein:
said plurality of data mode detection mechanisms comprises:
  a not-high-level data mode detection mechanism which generates a not-high data mode signal based on an inverted version of said high-level data signal, and
  a not-low-level data mode detection mechanism which generates a not-low data mode signal based on an inverted version of said low-level data signal; and
said plurality of data capture mechanisms comprises:
  a not-high-level data capture mechanism which receives said not-high data mode signal and said delayed high clock signal, captures said not-high data mode signal in synchronization with said delayed high clock signal to generate a not-high data state signal, and
  a not-low-level data capture mechanism which receives said not-low data mode signal and said delayed low clock signal, captures said not-low data mode signal in synchronization with said delayed low clock signal to generate a not-low data state signal.

10. The apparatus of claim 9, comprising:
a decoder circuit which decodes said deskewed high data state signal, said deskewed low data state signal, said no-high data state signal and said not-low data state signal to produce an intermediate data state signal to indicate that said data signal is neither in said high data state nor in said low data state.

11. The apparatus of claim 10, wherein:
said high data mode signal:
  follows said high-level data signal if said high-level data mode detection mechanism is selected to operate in said transparent mode; and
  asserts only if and when said high-level data signal becomes asserted at any time during a period in which said high-level data mode detection mechanism is selected to operate in said window compare mode;
said not-high data mode signal:
  follows said inverted version of said high-level data signal if said not-high-level data mode detection mechanism is selected to operate in said transparent mode; and
  asserts only if and when said inverted version of said high-level data signal becomes asserted at any time during a period in which said not-high-level data mode detection mechanism is selected to operate in said window compare mode;
said low data mode signal:
  follows said low-level data signal if said low-level data mode detection mechanism is selected to operate in said transparent mode; and
  asserts only if and when said low-level data signal becomes asserted at any time during a period in which said low-level data mode detection mechanism is selected to operate in said window compare mode; and
said not-low data mode signal:
  follows said inverted version of said low-level data signal if said low-level data mode detection mechanism is selected to operate in said transparent mode; and
  asserts only if and when said inverted version of said low-level data signal becomes asserted at any time during a period in which low-level data mode detection mechanism is selected to operate in said window compare mode.

12. The apparatus of claim 6, wherein a first delay element receives a clock signal to generate a delayed clock signal, and wherein one of said clock signal or said delayed clock signal represents said delayed high clock signal and the other of said clock signal or said delayed clock signal represents said delayed low clock signal.

13. The apparatus of claim 6, wherein said delayed high clock signal is generated by a first delay element connected to receive a clock signal and said delayed low clock signal is generated by a second delay element connected to receive said clock signal.

14. The apparatus of claim 13, wherein said first delay element and said second delay element reside internal to said apparatus.

15. The apparatus of claim 10, wherein:
said high-level data capture mechanism comprises a high flip-flop for receiving said high data mode signal and for generating said deskewed high data state signal upon receipt of an active edge of said delayed high clock signal while receiving said high data mode signal;
said not-high-level data capture mechanism comprises a not-high flip-flop for receiving said not-high data mode signal and for generating said not-high data state signal upon receipt of an active edge of said delayed high clock signal while receiving said not-high data mode signal;
said low-level data capture mechanism comprises a low flip-flop for receiving said low data mode signal and for generating said deskewed low data state signal upon receipt of an active edge of said delayed low clock signal while receiving said low data mode signal; and said not-low-level data capture mechanism comprises a not-low flip-flop for receiving said not-low data mode signal and for generating said not-low data state signal upon receipt of an active edge of said delayed low clock signal while receiving said not-low data mode signal.

16. A method for accomplishing virtual data deskewing of a high-level comparator signal and a low-level comparator signal which, if properly deskewed, together indicate a data signal state of a data signal, said data signal state being in one of a high data state wherein said data signal is above a high voltage threshold, a low data state wherein said data signal is below a low voltage threshold, or an intermediate state wherein said data signal is above said low voltage threshold and below said high voltage thresholds comprising the steps of:

(a) generating a delayed high clock signal and a delayed low clock signal which differ in delay amount in an amount substantially equal to a data skew caused by different delays in respective data paths of said high-level comparator signal and said low-level comparator signal;

(b) utilizing said delayed high clock signal to delay and capture one or more high-level window compare function outputs derived from said high-level comparator signal, and said delayed low clock signal to delay and capture one or more low-level window compare function outputs derived from said low-level comparator signal; and (c) decoding said high-level window compare function outputs and said low-level window compare function outputs to produce a high data signal indicating that said data signal is in said high data state and a low data signal indicating that said data signal is in said low data state.

17. The method of claim 16, said step (b) further comprising the steps of:

(b)(i) generating a high signal which is a window compare mode function of said high-level comparator signal, a not-high signal which is a window compare mode function of an inverted version of said high-level comparator signal, and a low signal which is a window compare mode function of said low-level comparator signal, and a not-low signal which is a window compare mode function of an inverted version of said low-level comparator signal; and (b)(ii) generating a high capture signal which reflects the state of said high signal at the time of an active edge of said delayed high clock signal, a not-high capture signal which reflects the state of said not-high signal at the time of an active edge of said delayed high clock signal, and a low capture signal which reflects the state of said low signal at the time of an active edge of said delayed low clock signal, and a not-low capture signal which reflects the state of said not-low signal at the time of an active edge of said delayed low clock signal.

18. The method of claim 17, further comprising the step of:

(d) decoding said high-level window compare function outputs and said low-level window compare function outputs to produce a high data signal indicating that said data signal is in said high data state and a low data signal indicating that said data signal is in said low data state.

19. The method of claim 16, further comprising the step of:

(e) decoding said high-level window compare function outputs and said low-level window compare function outputs to produce an intermediate capture signal indicating that said data signal is in said intermediate state.

* * * * *